(12) United States Patent
Ishihara et al.

(10) Patent No.: US 12,142,769 B2
(45) Date of Patent: Nov. 12, 2024

(54) OXYGEN REDUCTION CATALYST, FUEL CELL, AIR CELL, AND METHOD FOR PRODUCING OXYGEN REDUCTION CATALYST

(71) Applicant: NATIONAL UNIVERSITY CORPORATION YOKOHAMA NATIONAL UNIVERSITY, Yokohama (JP)

(72) Inventors: Akimitsu Ishihara, Yokohama (JP); Takaaki Nagai, Yokohama (JP)

(73) Assignee: NATIONAL UNIVERSITY CORPORATION YOKOHAMA NATIONAL UNIVERSITY, Yokohama (JP)

( * ) Notice: Subject to any disclaimer, the term of this patent is extended or adjusted under 35 U.S.C. 154(b) by 511 days.

(21) Appl. No.: 17/618,367

(22) PCT Filed: Jun. 9, 2020

(86) PCT No.: PCT/JP2020/022723
§ 371 (c)(1),
(2) Date: Dec. 10, 2021

(87) PCT Pub. No.: WO2020/250898
PCT Pub. Date: Dec. 17, 2020

(65) Prior Publication Data
US 2022/0255087 A1 Aug. 11, 2022

(30) Foreign Application Priority Data
Jun. 12, 2019 (JP) .................. 2019-109815

(51) Int. Cl.
*H01M 4/88* (2006.01)
*H01M 4/90* (2006.01)
(Continued)

(52) U.S. Cl.
CPC .......... *H01M 4/9033* (2013.01); *H01M 4/88* (2013.01); *H01M 12/08* (2013.01); *C23C 14/18* (2013.01); *C23C 14/28* (2013.01)

(58) Field of Classification Search
CPC ....... H01M 4/9033; H01M 4/88; H01M 12/08
See application file for complete search history.

(56) References Cited

U.S. PATENT DOCUMENTS

2007/0242010 A1 10/2007 Tanaka et al.
2009/0308282 A1 12/2009 Koyama et al.
(Continued)

FOREIGN PATENT DOCUMENTS

JP 2008-181696 A 8/2008
JP 2009-148706 A 7/2009
(Continued)

OTHER PUBLICATIONS

Wang et al. (Chemistry Letters, pp. 959-960, 1983).*
(Continued)

*Primary Examiner* — Olatunji A Godo
(74) *Attorney, Agent, or Firm* — Birch, Stewart, Kolasch & Birch, LLP

(57) ABSTRACT

Provided is a novel oxygen reduction catalyst having good stability and higher oxygen reduction performance.
The oxygen reduction catalyst includes a composite oxide comprising a conductive tin oxide containing Zr.

6 Claims, 7 Drawing Sheets

Test Example 2

Test Example 1

(51) Int. Cl.
*H01M 12/08* (2006.01)
*C23C 14/18* (2006.01)
*C23C 14/28* (2006.01)

(56) References Cited

U.S. PATENT DOCUMENTS

2015/0180023 A1* 6/2015 Xiao .................. H01M 4/0423
 429/231.8
2017/0098830 A1 4/2017 Ota et al.
2018/0337414 A1 11/2018 Takata et al.

FOREIGN PATENT DOCUMENTS

| | | |
|---|---|---|
| JP | 2018-195516 A | 12/2018 |
| KR | 10-2007-0102394 A | 10/2007 |
| WO | WO2008/007708 A1 | 1/2008 |
| WO | WO2015/146490 A1 | 10/2015 |

OTHER PUBLICATIONS

Ukita et al. (Electrochemistry, 2011, No. 5, pp. 340-342).*

English translation of the International Preliminary Report on Patentability for International Application No. PCT/JP2020/022723, dated Dec. 16, 2021.
International Search Report for PCT/JP2020/022723 (PCT/ISA/210) mailed on Aug. 25, 2020.
Ishihara et al., "Partially Oxidized Tantalum Carbonitrides as a New Nonplatinum Cathode for PEFC-1-", Journal of the Electrochemical Society, 155 (4), pp. B400-B406, (2008).
Ishihara et al., "Tantalum Oxynitride for a Novel Cathode of PEFC", Electrochemical and Solid-State Letters, 8 (4), pp. A201-A203, (2005).
Lee et al., "Stability and electrocatalytic activity for oxygen reduction in WC + Ta catalyst", Science direct, Electrochimica Acta 49 (2004), pp. 3479-3485.
Imai et al., "Structural defects working as active oxygen-reduction sites in partially oxidized Ta-carbonitride core-shell particles probed by using surface-sensitive conversion-electron-yield x-ray absorption spectroscopy", Applied Physics Letters 96, 191905 (2010), pp. 191905-1 to 191905-3.
Itagaki et al., "Development of Te Containing non-Pt Electrode Catalysts for Polymer Electrolyte Fuel Cell (2)", (Proceedings of ECSJ Fall Meating, 2007), total of 10 pages.

* cited by examiner

OXYGEN REDUCTION CATALYST, FUEL CELL, AIR CELL, AND METHOD FOR PRODUCING OXYGEN REDUCTION CATALYST

FIELD OF THE INVENTION

The present invention relates to an oxygen reduction catalyst for promoting an oxygen reduction reaction in an aqueous solution. More particularly, it relates to an oxygen reduction catalyst used for air electrodes of electrochemical devices such as fuel cells and air cells; a fuel cell; an air cell; and a method for producing an oxygen reduction catalyst.

BACKGROUND OF THE INVENTION

Fuel cells or air cells are electrochemical energy devices that use oxygen or the like in the air as an oxidizing agent and extracts energy generated by a chemical reaction of a compound as a fuel with a negative electrode active material, as electrical energy. The fuel cells and air cells have a higher theoretical energy capacity than that of secondary batteries such as Li-ion batteries, and can be used as power supplies for automobiles, stationary distributed power supplies for homes and factories, or power supplies for portable electronic devices, or the like.

On an oxygen electrode side of the fuel cell or the air cell, the electrochemical reaction in which oxygen is reduced is generated. The oxygen reduction reaction is difficult to proceed at a relatively low temperature, and the reaction can generally be accelerated by precious metal catalysts such as platinum (Pt). However, an energy conversion efficiency of the fuel cell or the air cell is still not sufficient. Further, since the oxygen reduction reaction takes place in a high potential region, even precious metals such as Pt are subject to dissolution and degradation, which causes a problem in terms of ensuring long-term stability and reliability. Furthermore, catalysts mainly based on the precious metals such as Pt are expensive, thereby increasing the overall price of systems of fuel cells and air cells and preventing their widespread use. Therefore, there is a need for development of inexpensive catalysts that do not use precious metals such as platinum and that have high oxygen reduction capacity.

Organometallic complexes, nitrogenated carbons, transition metal chalcogenides, transition metal carbonides, transition metal nitrides and the like are known as Pt-free catalysts, but all of them are insufficient in terms of catalytic activity and durability, and they have not been able to outperform the Pt-based catalysts.

Among them, some transition metal oxides of Group 4 and 5 elements being active against the oxygen reduction reaction are disclosed in Non-Patent Literatures 1 and 2. Further, Non-Patent Literature 3 and Patent Literature 1 mention that some of structural defects may function as active sites for the oxygen reduction reaction. Furthermore, Non-Patent Literatures 4, 5 and Patent Literature 1 disclose that conductive carbon and other materials are added during electrode construction.

The oxygen reduction reaction on the air electrode catalyst of the fuel cell or the air cell involves the transfer of electrons from the electrode, so that the electrons must be rapidly transferred from the electrode to the vicinity of the active site on the catalyst in order to obtain good oxygen reduction catalytic performance. Further, the reactants, oxygen and protons, must be rapidly delivered to the active site. However, the transition metal oxides of Group 4 and 5 elements as disclosed in the Non-Patent Literatures 1 to 3 and Patent Literature 1 generally have an insulating electronic state and hence poor conductivity, which will make it difficult to cause the rapid reaction. Therefore, although the transition metal oxides exhibit relatively high performance when the cell is operated at a lower current value, there is a problem that an operating voltage decreases in a higher current range.

Even with the methods as described in Non-Patent Literatures 4 and 5 and Patent Literature 1, it is difficult to construct and control an effective electron conduction pathway near the active site at a nano level, and the performance remains low. Further, the introduction of a large amount of conductive carbon inhibits the supply of oxygen to the active site of the catalyst. Therefore, there is a need for improving the oxygen reduction performance by both providing of conductivity and effective transporting of oxygen.

To address such problems, Patent Literature 2 discloses an oxygen reduction catalyst comprising: a conductive oxide; and an oxide of at least one transition metal selected from the group consisting of Ti, Zr, Nb, and Ta, wherein the oxide has oxygen vacancies and is provided on at least the surface of the conductive oxide. It also discloses that such a configuration can provide the oxygen reduction catalyst having good stability and higher oxygen reduction performance.

CITATION LIST

Patent Literatures

[Patent Literature 1] Japanese Patent Application Publication No. 2009-148706 A
[Patent Literature 2] WO 2015/146490 A1 Non-Patent Literature
[Non-Patent Literature 1] K Lee, et al., Electrochim. Acta, 49, 3479 (2004)
[Non-Patent Literature 2] A. Ishihara, et al., Electrochem. Solid-State Lett., 8, A201 (2005)
[Non-Patent Literature 3] H. Imai et al., APPLIED PHYSICS LETTERS 96, 191905 2010
[Non-Patent Literature 4] Proceedings of ECSJ Fall Meating, 2007
[Non-Patent Literature 5] Journal of The Electrochemical Society, 155(4), B400-B406 (2008)

SUMMARY OF THE INVENTION

Technical Problem

The oxygen reduction catalyst disclosed in Patent Literature 2 is constructed to use the conductive oxide having higher stability against carbon as a base material, and provide the transition metal oxide on the surface of the conductive oxide, which should function as the active site of the oxygen reduction reaction. However, the oxygen reduction catalyst is constructed to use the oxide as the base material and provide the further oxide on the surface that functions as the active site of the oxygen reduction reaction, so that there is an interface between the oxides in particles of the oxygen reduction catalyst. It is difficult for electricity to flow at the interface between these oxides. Therefore, there is a need for development of a novel oxygen reduction catalyst that has higher oxygen reduction performance with good electrical conductivity while maintaining stability.

The present invention has been made in view of such problems. An object of the present invention is to provide a novel oxygen reduction catalyst having good stability and higher oxygen reduction performance.

Solution to Problem

As a result of intensive studies, the present inventors have found that when conductive tin oxide is used as a base material having conductivity and the base material is doped with Zr in a certain method, a composite oxide composed of conductive tin oxide containing Zr can be produced. They have also found that the oxygen reduction catalyst containing the composite oxide can increase stability without using carbon as a base material. They have also found that, in contrast to a conventional oxide catalyst on a surface of an oxide conductor, the above oxygen reduction catalyst has no interface between the oxides, thereby improving the conductivity and further improving the oxygen reduction performance.

Thus, in an aspect, the present invention relates to an oxygen reduction catalyst, wherein the oxygen reduction catalyst comprises a composite oxide comprising a conductive tin oxide containing Zr.

In an embodiment of the oxygen reduction catalyst according to the present invention, the conductive tin oxide comprises zirconium having an oxidation number of +3.0 or more and less than +4.0, and the tin oxide is represented by the composition formula: $SnO_{x1}$, in which x1 is from 1 to 2.

In another embodiment of the oxygen reduction catalyst according to the present invention, the composite oxide has a BET specific surface area of from 10 to 200 m$^2$/g.

In yet another embodiment of the oxygen reduction catalyst according to the present invention, the composite oxide has a mass percentage ratio Zr/Sn of from 0.001 to 0.095.

In yet another embodiment of the oxygen reduction catalyst according to the present invention, the composite oxide has a volume resistivity of 10,000 Ωcm or less.

In another aspect, the present invention relates to a fuel cell comprising the oxygen reduction catalyst according to the present invention used as an air electrode.

In yet another aspect, the present invention relates to an air cell comprising the oxygen reduction catalyst according to the present invention used as an air electrode.

In still another aspect, the present invention relates to a method for producing the oxygen reduction catalyst according to the present invention, wherein the method comprises a step of doping the conductive tin oxide with Zr using an arc plasma vapor deposition method.

Advantageous Effects of Invention

According to the present invention, it is possible to provide a novel oxygen reduction catalyst having good stability and higher oxygen reduction performance.

Figure 1:
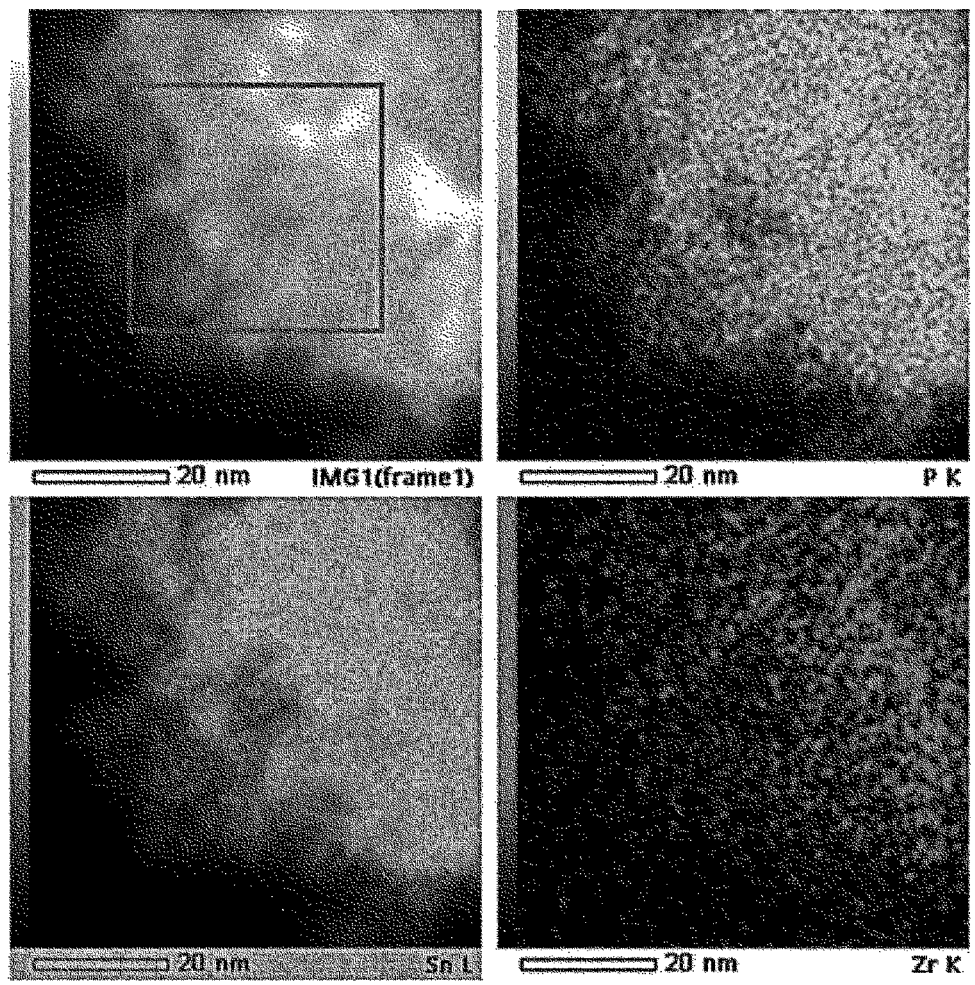
FIG. 1 is STEM images according to Test Example 1.

DETAILED DESCRIPTION OF THE INVENTION (Composition of Oxygen Reduction Catalyst)

An oxygen reduction catalyst in the present embodiment comprises a composite oxide comprised of conductive tin oxide containing Zr. The "Zr" refers to zirconium as an element. In the oxygen reduction catalyst of this embodiment, the conductive tin oxide can function as a base material and has good stability against materials such as carbon while having electrical conductivity. Further, Zr is contained in the conductive tin oxide, so that Zr effectively functions as an active site of the oxygen reduction reaction. In this case, the conductive tin oxide which is the conductive oxide as described above is present around Zr which is the active site, so that the conductive oxide forms a conduction pathway, and the oxygen reduction performance can be improved. Further, as there is no need to provide a transition metal oxide that functions as an active site on the surface of the oxide conductor as in the prior art, no interface between oxides is formed and the flow of electricity in the oxygen reduction catalyst is improved.

The Zr contained in the conductive tin oxide is preferably a zirconium cation. The zirconium cation may be contained as an independent particle, for example as a mass (cluster) of $ZrO_x$, or it may be contained, for example, in solid solution in the conductive tin oxide at an atomic level. The oxidation number of the zirconium is preferably +3.0 or more and less than +4.0. The oxidation number of zirconium of +4.0 corresponds to the oxidation number of $ZrO_2$ as an insulator. Other oxides of Zr are not present, and metal zirconium having the oxidation number of zero is present in a reduced state. The metal zirconium having the oxidation number of zero is conductive, but when it is used as the oxygen reduction catalyst, it reacts with oxygen immediately and the reaction ends at that time, so that the oxygen reduction reaction does not take place. In other words, the metal zirconium has a lower oxygen reduction activity. Therefore, in this embodiment, it is preferable that the conductive tin oxide contains an oxide corresponding to the oxidation number of +3.0 or more and less than +4.0, which has been reduced from $ZrO_2$ having an oxidation number of +4.0. The oxide corresponding to the oxidation number of +3.0 or more and less than +4.0 does not have high conductivity, but since the oxide is in a state of solid solution in the conductive tin oxide, electrons are supplied from the surroundings, and the oxide functions as an active site in the oxygen reduction reaction, resulting in an improved oxygen reduction reactivity.

The tin oxide in the conductive tin oxide that forms the base material is preferably represented by the composition formula $SnO_{x1}$. In the above formula, x1 is from 1 to 2. The conductive tin oxide is not particularly limited as long as the tin oxide exhibits conductivity. Examples of the conductive tin oxide includes P-doped tin oxide, Nb-doped tin oxide, Ta-doped tin oxide, V-doped tin oxide, and the like. The concentration of P, Nb, Ta, or V are not particularly limited as long as it exhibits the desired conductivity. For example, the concentration is preferably from 1 to 15% by mass, and more preferably from 5 to 10% by mass.

A shape for forming the conductive tin oxide as the base material is not particularly limited, but it may be, for example, a plate shape, a spherical shape, a fibrous shape, a layered shape, a porous shape or the like.

The oxygen reduction catalyst according to the present embodiment may contain impurities to the extent that they do not interfere with the desired oxygen reduction performance in the composite oxide. Examples of the impurities include F, Na, Si, S, Fe, Cu, Co, or Au. The oxygen reduction catalyst preferably contains the impurities in a minor amount, e.g., 100 ppm or less, and more preferably 10 ppm or less, and even more preferably no impurities.

In the composite oxide, the Zr functions as an active site of the oxygen reduction reaction. However, if the content is too high relative to Sn in the conductive tin oxide that forms the base material, the activity of the oxygen reduction reaction tends to decrease and the conductivity as a powder tends to decrease. From this viewpoint, in the oxygen reduction catalyst according to this embodiment, the composite oxide preferably has a mass percentage ratio Zr/Sn of from 0.001 to 0.095, and more preferably Zr/Sn of from 0.005 to 0.09, and even more preferably Zr/Sn of from 0.01 to 0.085.

In the oxygen reduction catalyst according to the present embodiment, an increased BET specific surface area of the composite oxide leads to an improved catalytic activity. On the other hand, a decreased BET specific surface area of the composite oxide leads to improved durability against repeated start-up and shut-down of the fuel cell or air cell. From this perspective, in the oxygen reduction catalyst according to this embodiment, the composite oxide preferably has a BET specific surface area of from 10 to 200 $m^2/g$, and more preferably 20 to 150 $m^2/g$, and even more preferably 30 to 100 $m^2/g$, and even more preferably from 50 to 100 $m^2/g$. The BET specific surface area of the composite oxide can be measured by a commercially available BET specific surface area measuring device.

In the oxygen reduction catalyst according to the present embodiment, excessively high volume resistivity of the composite oxide leads to decreased energy efficiency of the fuel cell or the air cell that employs the oxygen reduction catalyst. From such a viewpoint, in the oxygen reduction catalyst according to the present embodiment, the volume resistivity of the composite oxide is preferably 10,000 Ωcm or less, and more preferably 1,000 Ωcm or less, and even more preferably 100 Ωcm or less. The volume resistivity of the composite oxide can be measured by, for example, compression-molding the powder of the composite oxide and using a four-ended needle method. In the method, a resistance is determined by linearly arranging four needle-shaped electrodes (four-ended needle probes) on the surface of the molded body sample, passing a constant current between the two needles on the outer side, and measuring a potential difference generated between the two needles on the inner side.

(Method for Producing Oxygen Reduction Catalyst)

Next, a method for producing the oxygen reduction catalyst according to the present embodiment will be described.

First, the conductive tin oxide that forms the base material is prepared. When the conductive tin oxide doped with P, Nb, Ta or V is used, the doping amount of P, Nb, Ta or V can be adjusted as needed.

The conductive tin oxide is then doped with Zr using the arc plasma vapor deposition method. As used herein, "Zr" means zirconium as an element, and specifically, it means that the conductive oxide is doped with Zr in an ionic state (cation). The zirconium cations may be embedded in the conductive tin oxide of a support as an independent particle, for example, as a nano-sized or smaller cluster of $ZrO_x$, or they may be contained in solid solution in the conductive tin oxide at the atomic level, for example. The arc plasma vapor deposition method is a method of doping the conductive tin oxide with Zr by evaporating a Zr material that is a Zr deposition source, at or near the electrode (cathode electrode) by arc discharge to generate Zr plasma. The arc plasma vapor deposition method can be carried out using a commercially available arc plasma vapor deposition device. In the arc plasma vapor deposition method, a discharge voltage and capacitor capacity per shot can be adjusted as needed. For example, Zr plasma can be generated under conditions where the discharge voltage is 10 V or more and 200 V or less and the capacitor capacity is 30 μF or more and 1800 μF or less.

The Zr material is thus evaporated using the arc plasma vapor deposition method to generate Zr plasma, thereby doping the conductive tin oxide with Zr. This can provide the oxygen reduction catalyst containing the composite oxide comprised of conductive tin oxide containing zirconium having the oxidation number of +3.0 or more and less than +4.0 according to the present embodiment. Further, by evaporating the Zr material using the arc plasma vapor deposition method to generate Zr plasma, the zirconium having the oxidation number of +3.0 or more and less than +4.0, which is contained in the conductive tin oxide, can be embedded in the conductive tin oxide of the support as an independent particle, for example as a nano-sized or smaller cluster of $ZrO_x$, or can be contained, for example, in a state of solid solution in the conductive tin oxide at the atomic level.

In the arc plasma vapor deposition method in this embodiment, the conductive tin oxide is doped with Zr by evaporating the Zr material to generate Zr plasma while introducing a small amount of an oxygen gas into the vapor deposition device used. If no oxygen gas is contained at all, the Zr may be deposited in a metallic state and may be converted to an oxide in a fuel cell environment, which may not reach the state of the active oxide. In this case, an oxygen partial pressure is preferably controlled at 0.1 to 1.5 MPa.

When the Zr material is evaporated using the arc plasma vapor deposition method to generate Zr plasma, the Zr plasma combines with the oxygen present in the atmosphere to form zirconium oxide having oxygen vacancies. In the zirconium oxide having the oxygen vacancies, the Zr is in a reduced state. The doping with Zr by the conventional liquid-phase method leads to previous reduction of the base material Sn. However, the use of the arc plasma vapor deposition method as in this embodiment can allow the conductive tin oxide to be doped with Zr in the reduced state. Therefore, the Zr can function better as an active site in the conductive tin oxide.

The doping of the conductive tin oxide with Zr by evaporating the Zr material using the arc plasma vapor deposition method to generate Zr plasma can allow a larger amount of Zr to be present near the surfaces of the conductive tin oxide particles. This can allow the Zr to function as an active site while lowering an increase in internal resistance, better than those where the Zr is uniformly distributed to near the center of the conductive tin oxide particles.

When the arc plasma vapor deposition method is carried out using the arc plasma vapor deposition device, impurities caused by members of the arc plasma vapor deposition device may be contaminated in the conductive tin oxide. The oxygen reduction catalyst according to the present embodiment may contain impurities such as F, Na, Si, S, Fe, Cu, Co, and Au, which are caused by the members of the arc plasma vapor deposition device, although the amount is minor.

(Fuel Cell, Air Cell)

The oxygen reduction catalyst according to the present embodiment can be used to produce an air electrode. The air electrode can be used for fuel cells or air cells. An electrolytic solution for the fuel cell can employ electrolytic solutions having any property, such as an acidic solution, an alkaline solution, a neutral solution, and an organic solvent. Fuels for the fuel cells that can be used herein include hydrogen, methanol, a hydrogen compound, and the like, although not particularly limited thereto. Similarly, for the air cells, the electrolytic solution and the negative electrode active material are not particularly limited. It can also be used as an air electrode for a Li-air cell having a substance containing Li as a negative electrode.

EXAMPLES

Hereinafter, the present invention will be described in more detail with reference to Examples, but the present invention is not limited thereto.

Test Examples 1 and 2

First, for each of Test Example 1 and Test Example 2, P-doped $SnO_2$ forming the base material was prepared. In this case, a doping amount of P was 1% by mass.

The P-doped $SnO_2$ was then doped with Zn using an arc plasma vapor deposition device (APD-P from ADVANCE RIKO, Inc). Here, used as the Zr material, the Zr vapor deposition source, was a metal Zr rod, which was evaporated to generate Zr plasma, and the P-doped $SnO_2$ was doped with Zr in an ionic state while introducing a small amount of an oxygen gas into the vapor deposition device. The vapor deposition conditions in the arc plasma vapor deposition device are shown below:

Discharge voltage per shot was 100V, a capacitor capacity was 1080 µF;
Oxygen partial pressure was 0.89 MPa;
Frequency was 6 Hz;
Stirring mechanism was a vibration method; and
Total number of shots was 8,700 shots (Test Example 1), 87,000 shots (Test Example 2).

(STEM-EDX Analysis)

Figure 2:
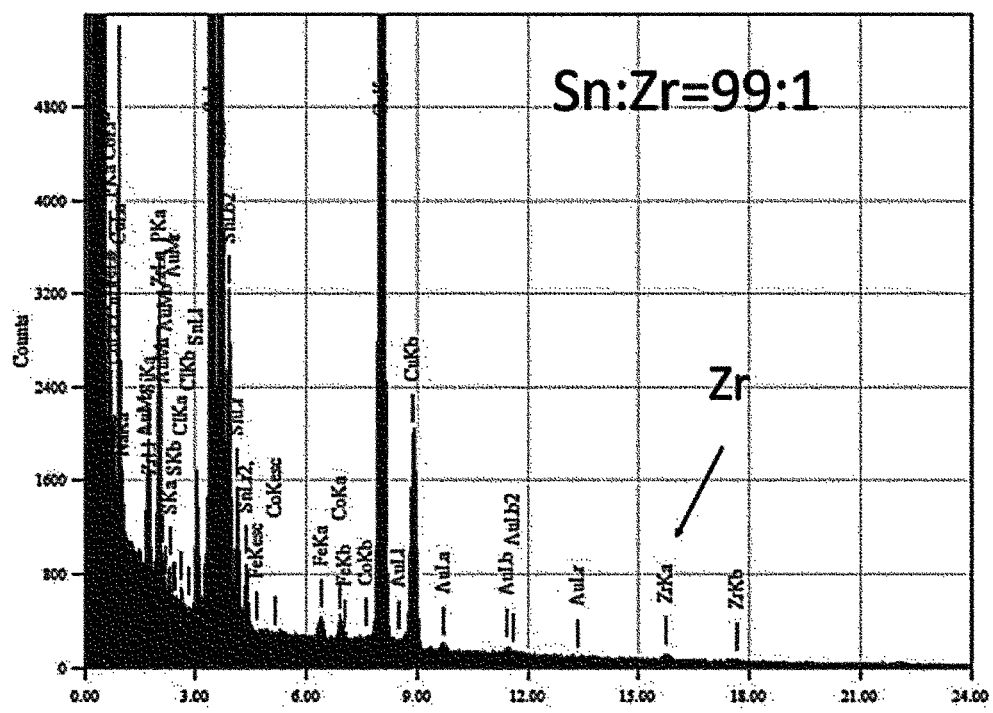
FIG. 2 is an EDX spectrum according to Test Example 1.
Figure 3:
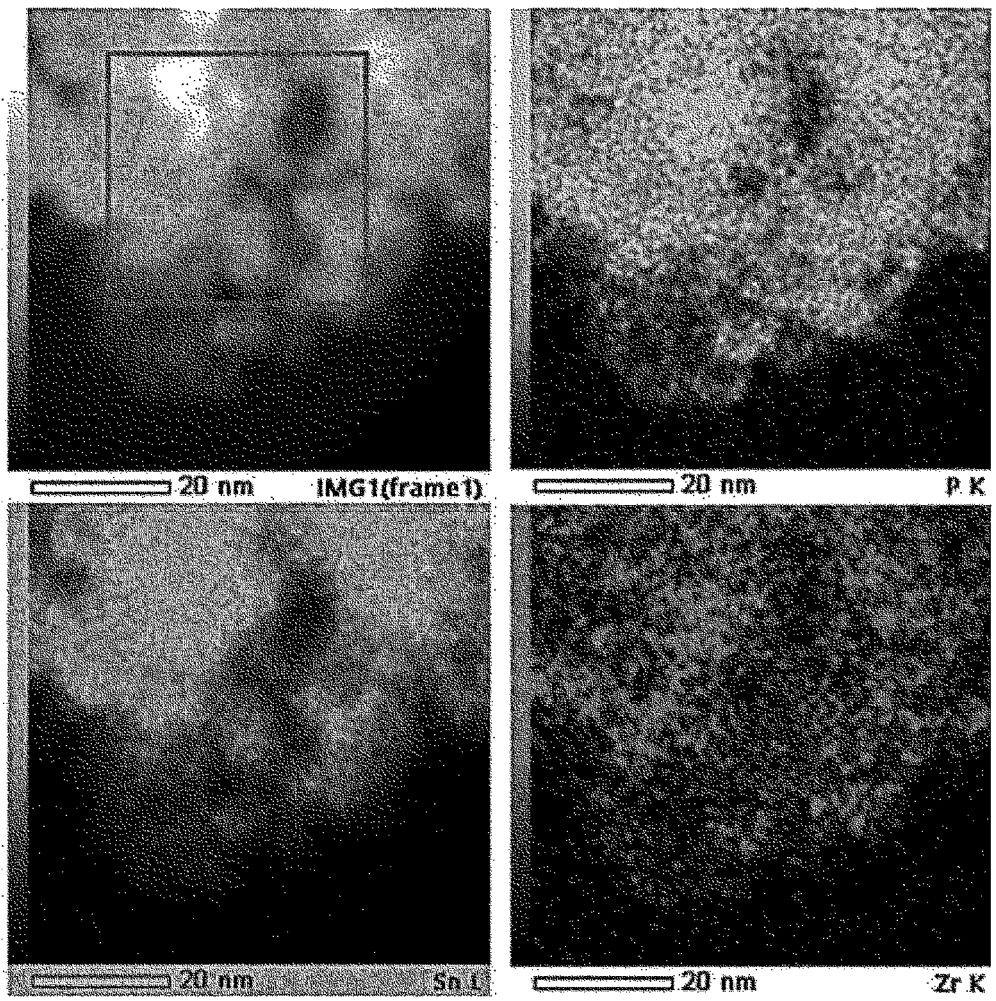
FIG. 3 is STEM images according to Test Example 2.
Figure 4:
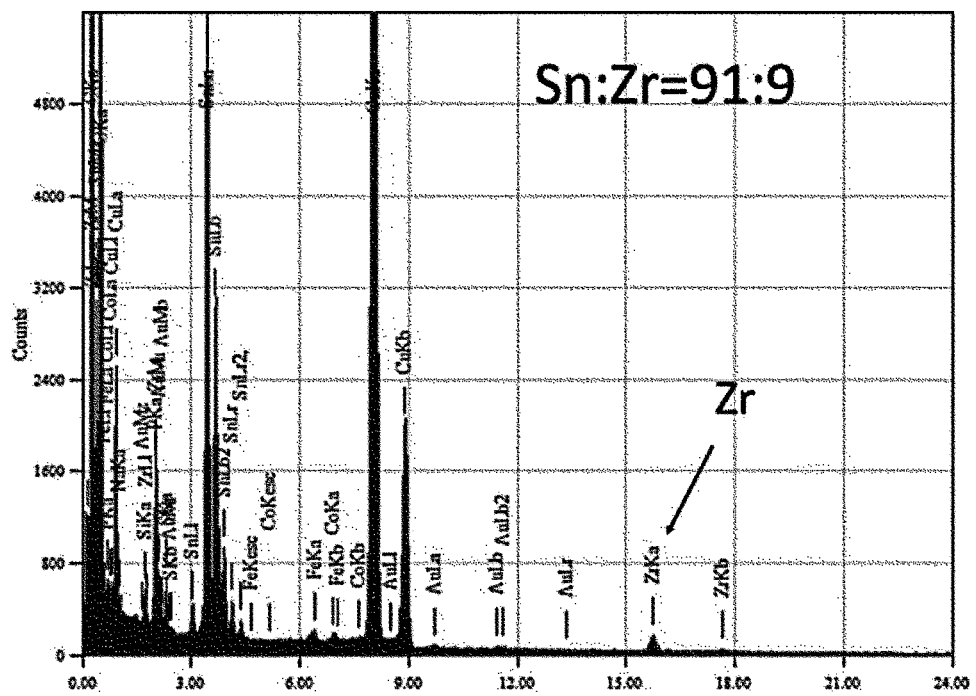
FIG. 4 is an EDX spectrum according to Test Example 2.

The oxygen reduction catalysts according to Test Examples 1 and 2 were subjected to STEM-EDX analysis by a JEM-ARM200F from JEOL Ltd., to obtain STEM images and EDX spectra shown in Test Examples 1 and 2. FIG. 1 shows the STEM images according to Test Example 1. FIG. 2 shows the EDX spectrum according to Test Example 1. FIG. 3 shows the STEM images according to Test Example 2. FIG. 4 shows the EDX spectrum according to Test Example 2. It was found from the STEM images that the distributions of Zr and, P and Sn were substantially the same for the oxygen reduction catalysts according to Test Examples 1 and 2, respectively. The EDX spectra also show that the mass percentage ratio of Sn to Zr in the oxygen reduction catalysts was Sn:Zr=99:1 (Test Example 1) and Sn:Zr=91:9 (Test Example 2).

(TEM Analysis)

Figure 5:
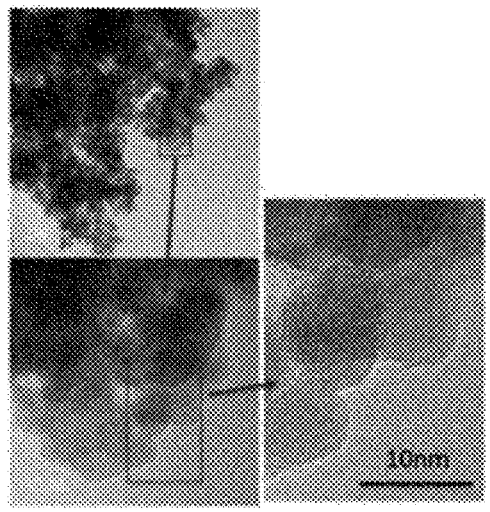
FIG. 5 is TEM images according to Test Example 1 and Test Example 2.
Figure 5:
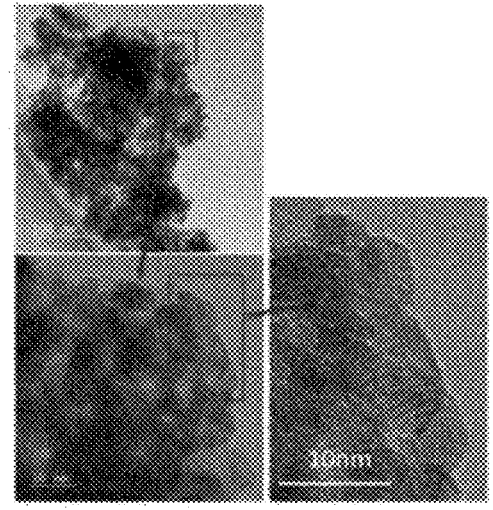

The oxygen reduction catalysts according to Test Example 1 and Test Example 2 were subjected to TEM analysis with JEM-ARM200F from JEOL Ltd., and the TEM images shown in FIG. 5 were obtained. According to FIG. 5, in each of Test Example 1 and Test Example 2, the particle diameter was about 10 nm, no significant difference was observed between them, and $ZrO_{x1}$ and $SnO_2$ could not be distinguished from each other, which expected that $ZrO_{x1}$ was in solid solution in $SnO_2$.

(Evaluation of Oxygen Reducibility)

The oxygen reducibility of each of the oxygen reduction catalysts according to Test Example 1 and Test Example 2 was evaluated as follows. That is, first, 10 mg of each oxygen reduction catalyst was collected and added to a mixed solution of 16.6 µL of 5% by mass Nafion (Registered trademark), and 428.4 µL of 1-hexanol solution to prepare a catalyst ink. Subsequently, the catalyst ink was dispersed by ultrasonication, and then dropped in a catalyst supporting amount of 0.15 mg as a measure, including the support, to mirror surface-processed glassy carbon (GC, φ5.2 mm, from Tokai Carbon Co., Ltd.), and dried in a constant temperature bath at 60° C. to obtain a product used as a working electrode. A three-electrode cell saturated with nitrogen was prepared using 0.1 mol/dm³ of $H_2SO_4$ as an electrolyte and at a temperature of 30±5° C. A reference electrode was a reversible hydrogen electrode (RHE), and a counter electrode was a glassy carbon plate. As a pretreatment, 300 cycles of cyclic voltammetry (CV) were carried out in an oxygen atmosphere at a scanning rate of 150 mV/s and in a range of 0.05 to 1.2 V vs. RHE. Subsequently, three cycles of slow scan voltammetry (SSV) were carried out at a scanning rate of 5 mV/s and in a range of 0.2 to 1.2 V vs. RHE in an oxygen atmosphere and a nitrogen atmosphere, respectively. An oxygen reduction current density $i_{ORR}$ was calculated by subtracting a background current density in the nitrogen atmosphere from a current density in the oxygen atmosphere obtained from the SSV in the third cycle.

Further, as Comparative Example 1, the oxygen reduction current density $i_{ORR}$ was calculated by the same procedure using the P-doped $SnO_{x1}$ itself (which was not doped with Zr), which was the base material used in Test Example 1, as an oxygen reduction catalyst.

Figure 6:
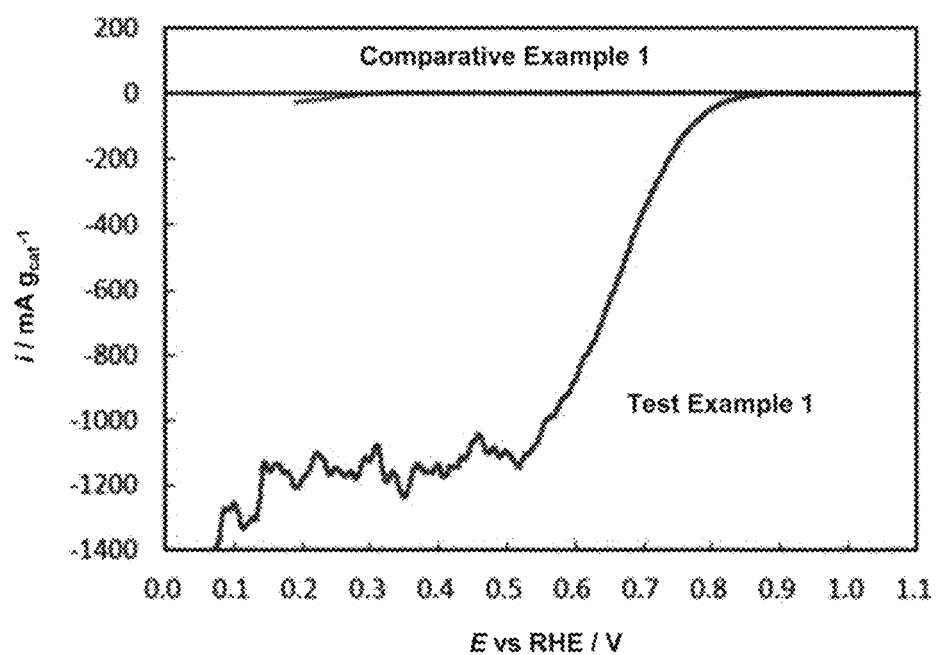
FIG. 6 is a graph showing a relationship between a current and a potential for ORR (oxygen reduction reaction) per unit mass including supports for catalysts according to Test Example 1 and Comparative Example 1.

Based on the above calculation results, FIG. 6 shows the relationship between the current and the potential of the ORR (oxygen reduction reaction) per unit mass including the supports for the catalysts according to Test Example 1 and Comparative Example 1. As can be seen from FIG. 6, in Test Example 1, the oxygen reduction has already begun at 0.9 V vs. RHE and the activity is higher.

Figure 7:
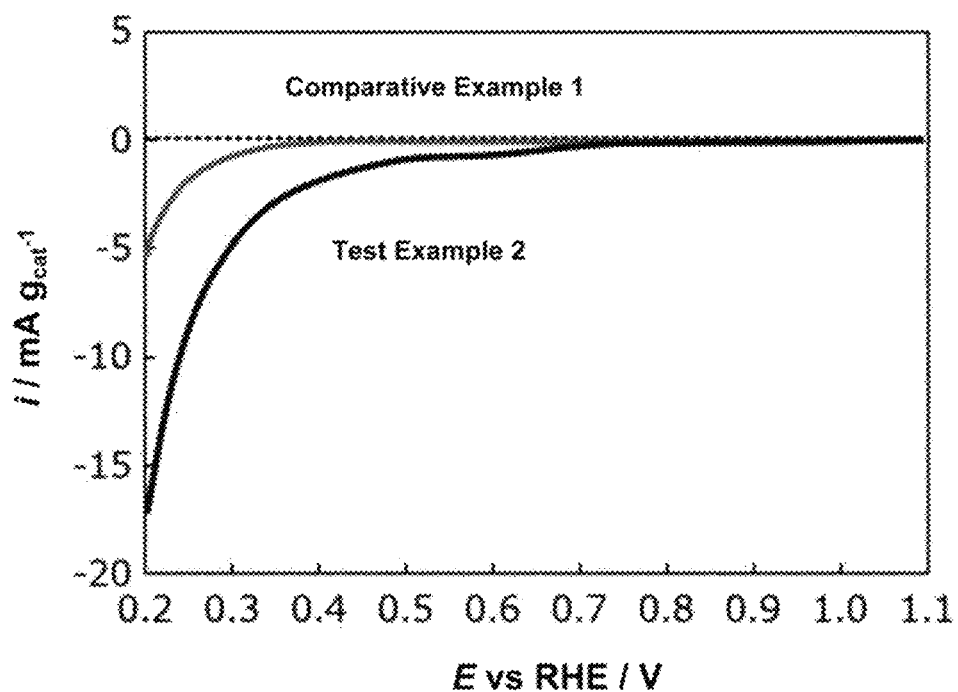
FIG. 7 is a graph showing a relationship between a current and a potential for ORR (oxygen reduction reaction) per unit mass including supports for catalysts according to Test Example 2 and Comparative Example 1.

Further, FIG. 7 shows the relationship between the current and the potential of the ORR (oxygen reduction reaction) per unit mass including the supports for the catalysts according to Test Example 2 and Comparative Example 1. As can be seen from FIG. 7, in Test Example 2, the oxygen reduction has already begun at 0.75 V vs. RHE and the activity is higher.

(Evaluation of BET Specific Surface Area)

The BET specific surface area of each of the oxygen reduction catalysts according to Test Example 1 and Test Example 2 was evaluated by BELSORP-mini from MicrotracBell Corp. As a result, the BET specific surface area of the composite oxide was 91 m²/g (Test Example 1) and 95 m²/g (Test Example 2).

(Volume Resistivity)

For each of the oxygen reduction catalysts according to Test Example 1 and Test Example 2, the powder of the composite oxide was compression-molded and measured by the four-ended needle method with Loresta-GX from Mitsubishi Chemical Analytech Co., Ltd. As a result, the volume resistivity of the composite oxide was 80 Ωcm (Test Example 1) and 80,000 Ωcm (Test Example 2).

The invention claimed is:

1. An oxygen reduction catalyst for an air cell, wherein the oxygen reduction catalyst comprises a composite oxide comprising a conductive tin oxide containing Zr, wherein the conductive tin oxide comprises zirconium having an oxidation number of +3.0 or more and less than +4.0, and wherein the tin oxide is represented by the composition formula: SnOx1, in which x1 is from 1 to 2, and wherein the composite oxide has a volume resistivity of 10,000 Ωcm or less.

2. The oxygen reduction catalyst according to claim 1, wherein the composite oxide has a BET specific surface area of from 10 to 200 m$^2$/g.

3. The oxygen reduction catalyst according to claim 1, wherein the composite oxide has a mass percentage ratio Zr/Sn of from 0.001 to 0.095.

4. A fuel cell, comprising the oxygen reduction catalyst according to claim 1 used as an air electrode.

5. An air cell, comprising the oxygen reduction catalyst according to claim 1 used as an air electrode.

6. A method for producing the oxygen reduction catalyst according to claim 1, wherein the method comprises a step of doping the conductive tin oxide with Zr using an arc plasma vapor deposition method.

* * * * *